United States Patent
Yeh et al.

(10) Patent No.: US 7,843,696 B2
(45) Date of Patent: Nov. 30, 2010

(54) HEAT SINK ASSEMBLY

(75) Inventors: Chin-Wen Yeh, Taipei Hsien (TW);
Zhi-Jian Peng, Shenzhen (CN);
Zhen-Neng Lin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/489,849

(22) Filed: Jun. 23, 2009

(65) Prior Publication Data
US 2010/0271786 A1    Oct. 28, 2010

(30) Foreign Application Priority Data
Apr. 25, 2009    (CN) .......................... 2009 2 0302587

(51) Int. Cl.
*H05K 7/20*    (2006.01)
(52) U.S. Cl. .................. 361/704; 361/719; 257/707; 257/718; 257/719; 165/80.3; 165/185
(58) Field of Classification Search .................. None
See application file for complete search history.

(56) References Cited

U.S. PATENT DOCUMENTS

| | | | | |
|---|---|---|---|---|
| 5,862,038 A * | 1/1999 | Suzuki et al. | ............... | 361/704 |
| 5,969,949 A * | 10/1999 | Kim et al. | .................... | 361/704 |
| 6,281,573 B1 * | 8/2001 | Atwood et al. | .............. | 257/706 |
| 6,313,995 B1 * | 11/2001 | Koide et al. | ................. | 361/705 |
| 6,404,638 B1 * | 6/2002 | Messina | ..................... | 361/715 |
| 6,867,976 B2 * | 3/2005 | Belady et al. | ............... | 361/704 |
| 2003/0075312 A1 * | 4/2003 | Panek | ......................... | 165/185 |
| 2006/0215369 A1 * | 9/2006 | Ohashi et al. | ............... | 361/704 |
| 2009/0109626 A1 * | 4/2009 | Sinha | ........................ | 361/704 |

* cited by examiner

*Primary Examiner*—Boris L Chervinsky
(74) *Attorney, Agent, or Firm*—D. Austin Bonderer

(57) ABSTRACT

A heat sink assembly includes a heat sink main body and a contact member attached to a base of the heat sink main body. The contact member includes a container with thermal grease contained therein and a movable cover movably attached to the container. The container includes a bottom plate configured to contact a heat generating component, and a plurality of holes defined in the bottom plate. When the heat sink is attached to the heat generating component, the movable cover is pressed towards the container and impels the thermal grease out from the holes to spread the thermal grease between the bottom plate of the container and the heat generating component.

20 Claims, 4 Drawing Sheets

HEAT SINK ASSEMBLY

BACKGROUND

1. Technical Field

The present disclosure relates to heat dissipation, and particularly to a heat sink having thermal grease being spreading out when the heat sink is assembled to a heat generating component.

2. Description of Related Art

A heat sinks is typically used to dissipate heat generated by a central processing unit (CPU). Thermal grease may be applied to a bottom surface of the heat sink before mounting to improve heat conductivity between the heat sink and the CPU module. However, thermal grease can rarely be directly applied to the heat sink in advance because it is not solid at ambient temperature, it may contaminate surrounding articles, and can be contaminated by dust or foreign particles. A removable protective cap for enclosing the thermal grease, disclosed in U.S. Pat. No. 6,049,458, includes a periphery removably attached to a bottom surface of a heat sink around the thermal grease, and a middle protrusion defining a cavity receiving the thermal grease. The protective caps, however, are commonly made of plastic and may twist under pressure, and contact against the thermal grease, affecting the heat conductivity between the heat sink and the CPU module.

Therefore, there is room for improvement in the art.

DETAILED DESCRIPTION

Figure 1:
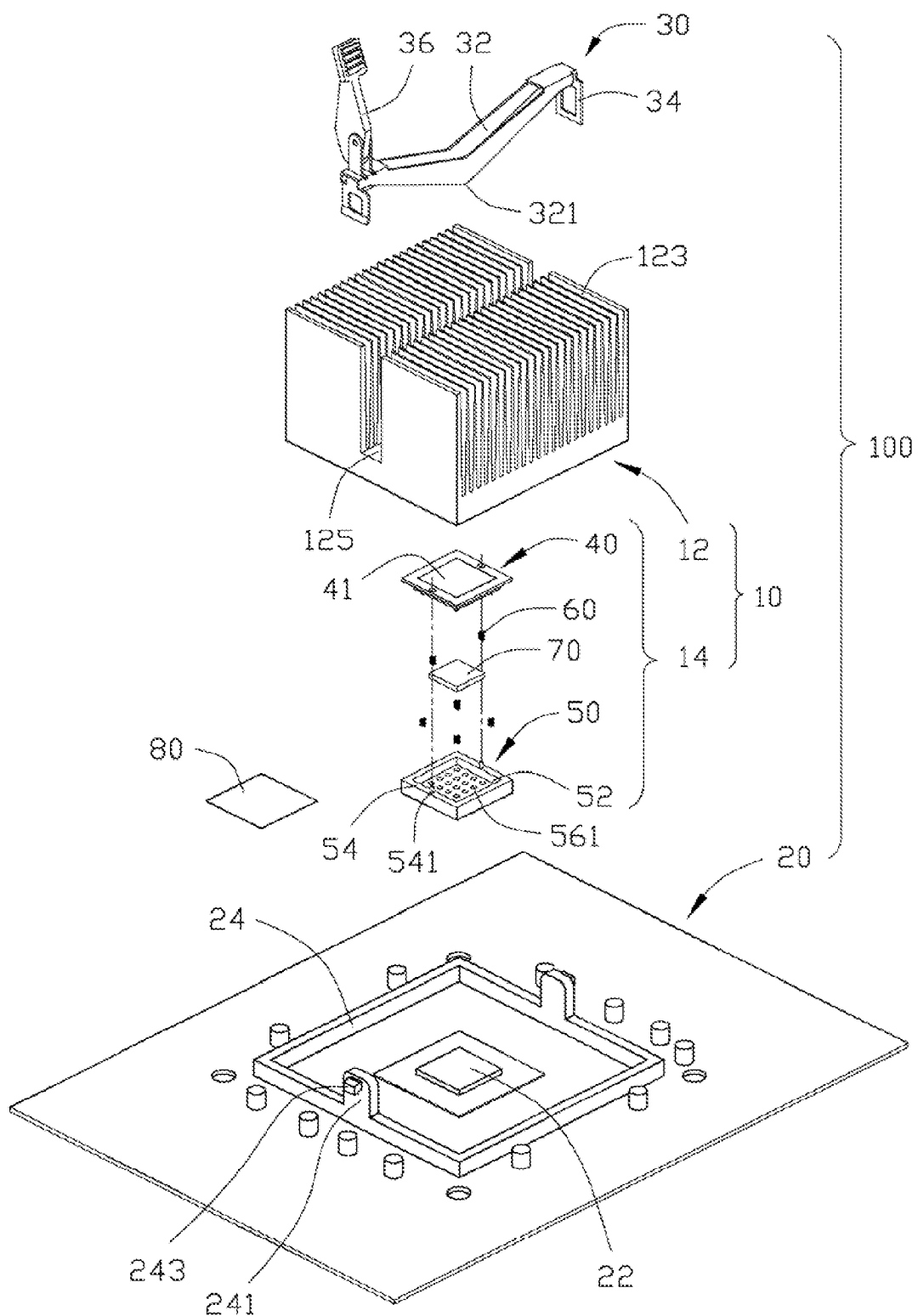
FIG. 1 is an exploded, isometric view of an embodiment of a heat sink assembly.
Figure 2:
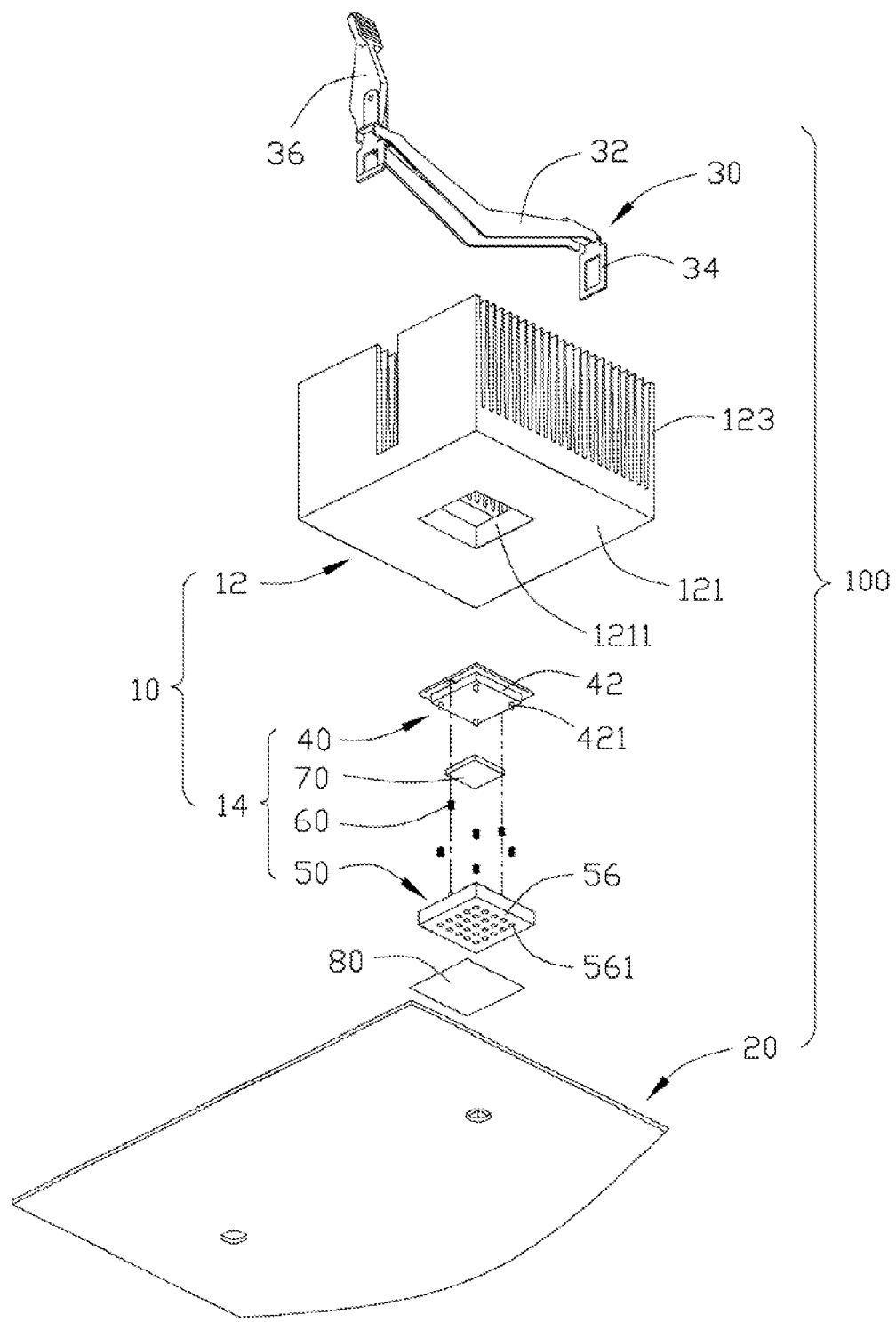
FIG. 2 is another view of FIG. 1.

Referring to FIGS. 1 and 2, a heat sink assembly 100 in accordance with an embodiment includes a heat sink 10, a motherboard 20 with a heat generating component 22 (such as a CPU) mounted thereon, and a latch member 30 configured to secure the heat sink 10 to the heat generating component 22.

The heat sink 10 includes a heat sink main body 12 and a contact member 14 configured to contact the heat generating component 22. The heat sink main body 12 includes a flat base 121, a plurality of fins 123 integrally projecting upwardly from the base 121, and a gap 125 defined in the fins 123 for receiving the latch member 30. A rectangular recess 1211 is defined in a central portion of the base 121 for attaching the contact member 14 thereto.

The contact member 14 comprises a movable cover 40, a container 50, and a plurality of spring members 60. The movable cover 40 comprises a top plate 41 and a rectangular protrusion 42 protruding downwards from an underside of the top plate 41. The top plate 41 is wider than the protrusion 42. A plurality of posts 421 protrude downwards from the protrusion 42.

The container 50 includes a bottom plate 56 and a side flange 54 extending upwards from a perimeter of the bottom plate 56. A cavity (not labeled) is formed by the bottom plate 56 and the side flange 54 to accommodate thermal grease 70 therein. A plurality of holes 561 is regularly defined in the bottom plate 56. A pair of posts 541 protrudes upwards from opposite sides of the side flange 54.

A fixing bracket 24 is mounted on the motherboard 20 and surrounds the heat generating component 22. A pair of fixing tabs 241 protrudes upwardly from opposite sides of the fixing bracket 24 respectively. A hook portion 243 protrudes outwards from each of the fixing tabs 241.

The latch member 30 includes a V-shaped main body 32 with a cusp 321 configured to contact the movable cover 40. A pair of securing ends 34 corresponding to the hook portion 243 of the fixing bracket 24 extends downwards from two distal ends of the V-shaped main body 32. A handle 36 is attached to one distal end of the V-shaped main body 32.

Figure 3:
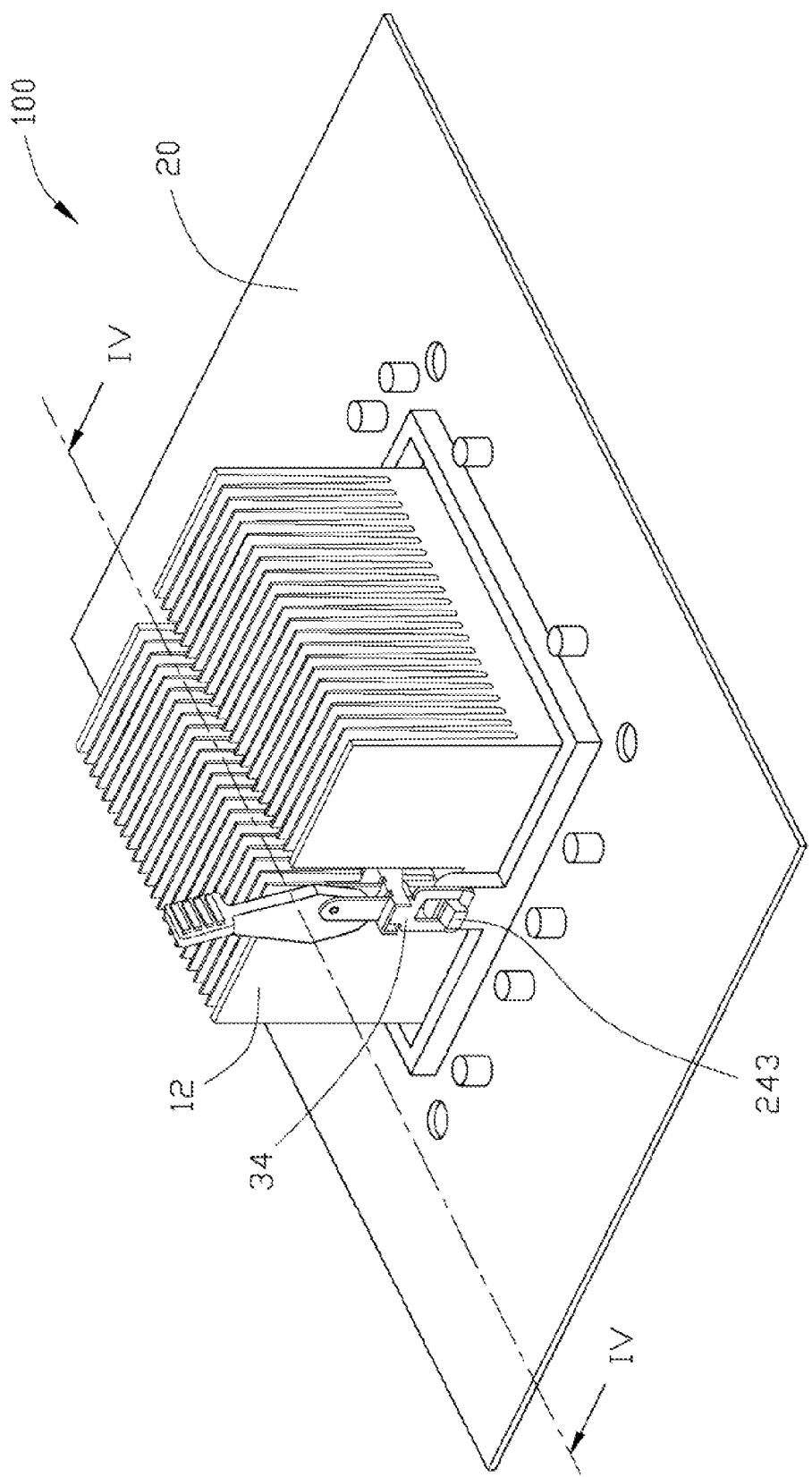
FIG. 3 is an assembled, isometric view of the heat sink assembly of FIG. 1.
Figure 4:
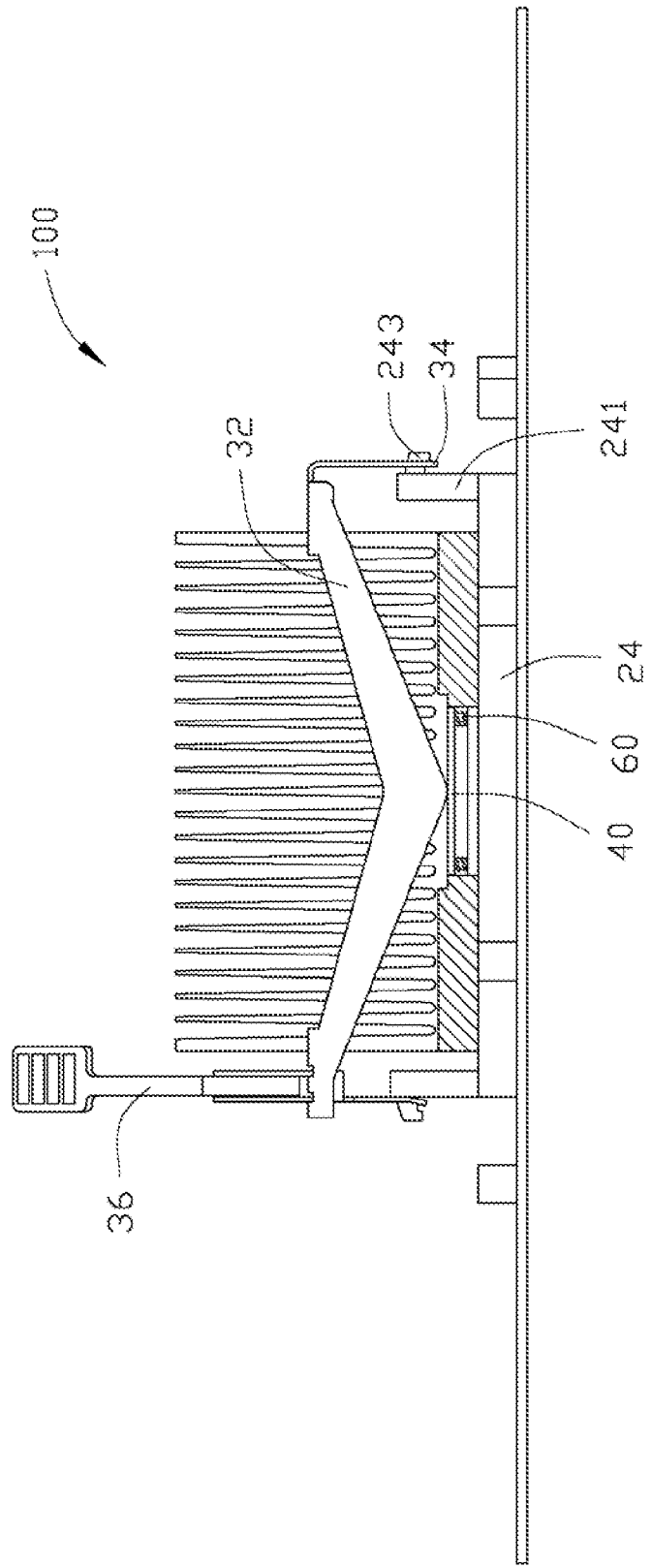
FIG. 4 is a cross section of the heat sink assembly view of FIG. 3, taken along line IV-IV.

Referring to FIGS. 3 and 4, the movable cover 40 is movably mounted in the recess 1211 of the heat sink main body 12. The spring members 60 are attached to the posts 421, 541. The container 50 is fixed in and protrudes from the recess 1211. The spring members 60 are sandwiched between the movable cover 40 and the container 50. The movable cover 40 is supported by the spring members 60. The protrusion 42 of the cover 40 is movable in the cavity of the container 50 to impel the thermal grease out from the container 50. The main body 32 of latch member 30 is accommodated in the gap 125 of the heat sink 10. The handle 36 of the latch member 30 is operated to force the latch member 30 downwards. The securing ends 34 of the latch member 30 engage the hook portions 243 of the fixing bracket 24 of the motherboard 20 to secure the heat sink 10 on the heat generating component 22. The movable cover 40 is contacted and pressed down slightly by the cusp 321 of the latch member 30. The protrusion 42 of the cover 40 moves in the cavity of the container 50 to impel the thermal grease out from the holes 561 of contact member 14, thereby spreading the thermal grease between the bottom plate 56 of the contact member 14 and a top surface of the heat generating component 22.

The spring members 40 are originally longer than a height of posts 541 and 421, thereby allowing the protrusion 42 of the movable cover 40 to move in the cavity of the container 50 to impel the thermal grease 70. Before the heat sink 10 is attached to the heat generating component 22, the thermal grease 70 is contained in the contact member 40 and protected from contamination by dust or foreign particles. A protecting paper 80 may be attached to the bottom plate 56 of the contact member 14 to envelop the holes 561 to protect the thermal grease 70 during storage and transport of the heat sink 10. Before the heat sink 10 is assembled to the heat generating component 22, the protecting paper is pulled and detached from the heat sink 10 for allowing the thermal greasing 70 ejecting out from the holes 561.

While the disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A heat sink comprising:
   a heat sink main body comprising a flat base, and a plurality of fins extending from the base; and
   a contact member attached to the base, the contact member comprising a container with thermal grease contained therein and a movable cover attached to the container, the container comprising a bottom plate configured to contact a heat generating component, and a plurality of holes defined in the bottom plate;

wherein when the heat sink is assembled to the heat generating component, the movable cover is pressed and moves towards the container and squeezes the thermal grease out of the holes to spread the thermal grease between the bottom plate of the container and the heat generating component.

2. The heat sink of claim 1, further comprising a piece of removable protecting paper attached to the bottom panel of the container to protect the thermal grease before the heat sink assembled to the heat generating component.

3. The heat sink of claim 1, wherein the container further comprises a side flange that extends from a perimeter of the bottom plate of the container and a cavity formed by the bottom plate and the side plate to enclose the thermal grease.

4. The heat sink of claim 3, wherein the container further comprises at least a pair of posts projecting upwardly from opposite sides of the side flange, and a pair of spring members to support the cover.

5. The heat sink of claim 4, wherein an original length of the spring member is longer than that of the posts.

6. The heat sink of claim 3, wherein the cover comprises a top panel and a protrusion extending downwards from the top panel, the protrusion is movable in the cavity.

7. The heat sink of claim 6, wherein both the protrusion and the cavity have a rectangular shape.

8. The heat sink of claim 7, wherein the cover further comprises at least a pair of posts extending downwards from two opposite corners of the protrusion, and a pair of spring members is attached to the posts respectively to support the cover.

9. The heat sink of claim 1, wherein a recess is defined in a central portion of the base of the heat sink main body, the cover is movably mounted in the recess, and the container is securely mounted to the recess.

10. The heat sink of claim 9, wherein the cover is exposed and accessible through the recess.

11. A heat sink assembly comprising:

a motherboard with a heat generating component mounted thereon;

a heat sink comprising a heat sink main body and a contact member with thermal grease contained therein, the contact member comprising a bottom plate configured to contact the heat generating component, and a plurality of holes defined in the bottom plate; and a latch member for mounting the heat sink on the heat generating component and contacting the contact member to cause the thermal grease out of the holes to spread the thermal grease between the bottom plate of the contact member and the heat generating component.

12. The heat sink assembly of claim 11, wherein a recess is defined in the base of the heat sink main body, and the contact member comprises a cover movably mounted in the recess and a container fixed in and protruding from the recess for contacting the heat generating component.

13. The heat sink assembly of claim 12, wherein the container defines a cavity therein for containing the thermal grease, the cover comprising a protrusion movable in the cavity to expel the thermal grease out from the holes.

14. The heat sink assembly of claim 12, wherein at least one spring member is sandwiched between the cover and the container to support the cover.

15. The heat sink assembly of claim 12, wherein the cover is accessible through the recess for being contacted by the latch member.

16. The heat sink assembly of claim 15, wherein the latch member comprises a main body with a cusp contacting the cover when the heat sink is attached to the heat generating component.

17. The heat sink assembly of claim 16, wherein the heat sink main body comprises a plurality of fins projecting from the base and a gap receiving the latch member.

18. The heat sink assembly of claim 17, wherein a fixing bracket is secured on the motherboard and surrounds the heat generating component, and the latch member is secured to the fixing bracket.

19. The heat sink assembly of claim 18, wherein the latch member further comprises a pair of securing ends extending downwards from two distal ends of the main body, the fixing bracket comprises a pair of hooks engaging the securing ends to secure the heat sink.

20. The heat sink assembly of claim 18, wherein a piece of protecting paper is attached to the bottom plate of the contact member to protect the thermal grease before the heat sink is attached to the heat generating component.

* * * * *